United States Patent
Pouilly et al.

(10) Patent No.: US 11,445,643 B2
(45) Date of Patent: Sep. 13, 2022

(54) ELECTRICAL ASSEMBLY OF AN ELECTRICAL BUSBAR AND A COOLING MODULE

(71) Applicant: Valeo Siemens eAutomotive France SAS, Cergy (FR)

(72) Inventors: Aurélien Pouilly, Poissy (FR); Alexandre Legendre, Jouy-le-Moutier (FR)

(73) Assignee: VALEO SIEMENS EAUTOMOTIVE FRANCE SAS, Cergy (FR)

( * ) Notice: Subject to any disclaimer, the term of this patent is extended or adjusted under 35 U.S.C. 154(b) by 0 days.

(21) Appl. No.: 16/720,895

(22) Filed: Dec. 19, 2019

(65) Prior Publication Data

US 2020/0205319 A1 Jun. 25, 2020

(30) Foreign Application Priority Data

Dec. 21, 2018 (FR) ...................................... 1873994

(51) Int. Cl.
*H05K 7/20* (2006.01)
*H02G 5/10* (2006.01)
*H02M 7/00* (2006.01)

(52) U.S. Cl.
CPC .......... *H05K 7/20927* (2013.01); *H02G 5/10* (2013.01); *H02M 7/003* (2013.01)

(58) Field of Classification Search
CPC ..... H01L 23/36; H01L 23/367; H01L 23/473; H02M 7/003; H05K 7/20927; H05K 7/1432; H05K 7/209; H05K 7/2089; H05K 1/0203; H05K 7/20254; H05K 1/181; H05K 7/20272; H05K 7/20; H05K 7/20872; H02G 5/10
See application file for complete search history.

(56) References Cited

U.S. PATENT DOCUMENTS

| | | | | |
|---|---|---|---|---|
| 4,814,030 A * | 3/1989 | Dubuisson | ............ | H01L 23/467 156/155 |
| 5,365,424 A * | 11/1994 | Deam | ...................... | H01L 23/52 174/72 B |
| 5,586,004 A * | 12/1996 | Green | ................. | H05K 7/20536 361/699 |
| 6,052,284 A * | 4/2000 | Suga | ...................... | H01L 23/473 361/699 |
| 2003/0053298 A1* | 3/2003 | Yamada | ............. | H05K 7/20872 361/728 |

(Continued)

FOREIGN PATENT DOCUMENTS

| | | |
|---|---|---|
| DE | 102016218151 A1 | 3/2018 |
| WO | 2013136877 A1 | 9/2013 |

OTHER PUBLICATIONS

French Search Report for Application No. 1873994 dated Oct. 1, 2019.

*Primary Examiner* — Adam B Dravininkas
(74) *Attorney, Agent, or Firm* — McCormick, Paulding & Huber PLLC

(57) ABSTRACT

The invention concerns an electrical assembly comprising a cooling module, in particular an active cooling module comprising a network in which a cooling liquid flows and an electrical busbar, where the said electrical busbar is attached directly to a portion for receiving the cooling module, where the said electrical assembly is configured to be added in a frame of a first electrical device.

12 Claims, 4 Drawing Sheets

(56) References Cited

U.S. PATENT DOCUMENTS

| | | | | |
|---|---|---|---|---|
| 2003/0133267 A1* | 7/2003 | Beihoff | ............. | H05K 7/20927 |
| | | | | 361/704 |
| 2004/0062006 A1* | 4/2004 | Pfeifer | ................. | H01L 23/473 |
| | | | | 361/699 |
| 2004/0230847 A1* | 11/2004 | Patwardhan | .......... | H02M 1/126 |
| | | | | 713/300 |
| 2004/0256710 A1* | 12/2004 | Schwarzbauer | ........ | H01L 24/49 |
| | | | | 257/690 |
| 2007/0096278 A1* | 5/2007 | Nakatsu | ................ | H01L 25/072 |
| | | | | 257/678 |
| 2008/0251909 A1* | 10/2008 | Tokuyama | ........... | H01L 23/473 |
| | | | | 257/706 |
| 2017/0201083 A1 | 7/2017 | Amar et al. | | |

\* cited by examiner

FIG. 2

ELECTRICAL ASSEMBLY OF AN ELECTRICAL BUSBAR AND A COOLING MODULE

CROSS-REFERENCE TO RELATED APPLICATION

This application claims foreign priority benefits under 35 U.S.C. § 119 to French Patent Application No. 1873994 filed on Dec. 21, 2018, the content of which is hereby incorporated by reference in its entirety.

TECHNICAL FIELD

The present invention relates to the field of electrical devices, in particular for vehicles, such as inverters.

More specifically, the present invention refers to a subassembly of such devices, i.e. an electrical assembly formed on a cooling module and having an electrical busbar.

BACKGROUND

In many electrical devices, in particular electrical power devices such as inverters configured to power an electric vehicle motor, cooling modules are comprised.

A cooling module, as it is known, is used to evacuate heat produced by electrical components, such as electronic cards or DC-link elements in particular.

An active cooling module uses an external body, in particular a cooling liquid such as water, for example, which, when it flows between an inlet and an outlet of the cooling module, where the said cooling module is positioned close to or in contact with at least one element requiring cooling, enables the temperature of the said element requiring cooling to be reduced.

A passive cooling module, also referred to as a thermal dissipator, does not involve the use of an external body. A thermal dissipator generally consists of a material with satisfactory thermal conductivity. It can comprise radiator elements, vanes, configured to facilitate heat dissipation.

In an electrical device such as a power inverter an active cooling module is used. In what follows, the expression "cooling module" refers to an active cooling module.

Incidentally, in processes to assemble electrical devices improved modularity is now sought, particularly to facilitate assembly by using integral independent subassemblies.

Against this background, the present invention refers to an electrical device shaped on a cooling module a portion of which receives, directly attached to the said module, an electrical busbar, configured in particular to receive at least one electrical connector of another electrical device. For example, in the context of a vehicle inverter, the said electrical busbar can be an alternating electrical busbar, also referred to as an "AC busbar", configured to receive phase connectors of an electric motor of the vehicle.

SUMMARY

To this end, the present invention refers to an electrical assembly comprising a cooling module, in particular an active cooling module comprising a network in which a cooling liquid flows, and an electrical busbar, where the said electrical busbar is directly attached to a reception portion of the cooling module, where the said electrical assembly is configured to be attached in a frame of a first electrical device.

According to one implementation the electrical busbar is screwed on to the reception portion of the cooling module.

According to one implementation an electronic power module attached to a first surface of the cooling module and a capacitive link element attached to a second surface, opposite the first surface, of the cooling module.

According to one implementation the said reception portion comprises opposite faces which are respectively in the same plane as the first surface of the cooling module, and as the second surface of the cooling module.

According to one implementation the cooling module has a first portion comprising the first and the second surface, and in which the said reception portion forms a fork extending from the first portion of the cooling module.

According to one implementation the electrical busbar comprises:
a first portion held between two arms of the fork, and
a cross arm extending from one side of the first portion, where the said cross arm is positioned at the junction of the fork with the first portion of the cooling module, where the said cross arm extends along the first surface of the cooling module, and comprises connection terminals which are positioned opposite terminals of the said power module and are then connected to them.

According to one implementation the cooling module has a cooling liquid inlet and a cooling liquid outlet, and the cooling module is configured such that the cooling liquid flows between the electronic power module and the capacitive link element.

According to one implementation the electrical busbar comprises a body made of an electric insulating material holding together conductors of the electrical busbar, where the said body is placed next to the cooling module so as to enable thermal dissipation of the heat from the conductors to the cooling module.

The present invention also refers to an electrical device comprising a case in which an electrical device as briefly described above is held.

According to one implementation the said electrical device forms an inverter.

BRIEF DESCRIPTION OF THE DRAWINGS

The invention will be better understood on reading the following description, given as an example only, which makes reference to the appended drawings, given as non-restrictive examples, in which identical references are given to similar objects, and in which:

FIG. 2 represents the example of an electrical assembly according to the previous invention, to which an electronic power module and a capacitive link element are attached;

It should be noted that the figures explain the invention in detail in order to implement the invention, and that the said figures can of course be used to improve the definition of the invention, if applicable.

DETAILED DESCRIPTION

In the description which will be given below the invention will be described principally for the purpose of producing an inverter, configured in particular to power an electrical machine such as a rotating electrical machine of a motor system of a vehicle. However, the invention also refers to all electrical devices able to comprise an electrical assembly as described below.

Figure 1:
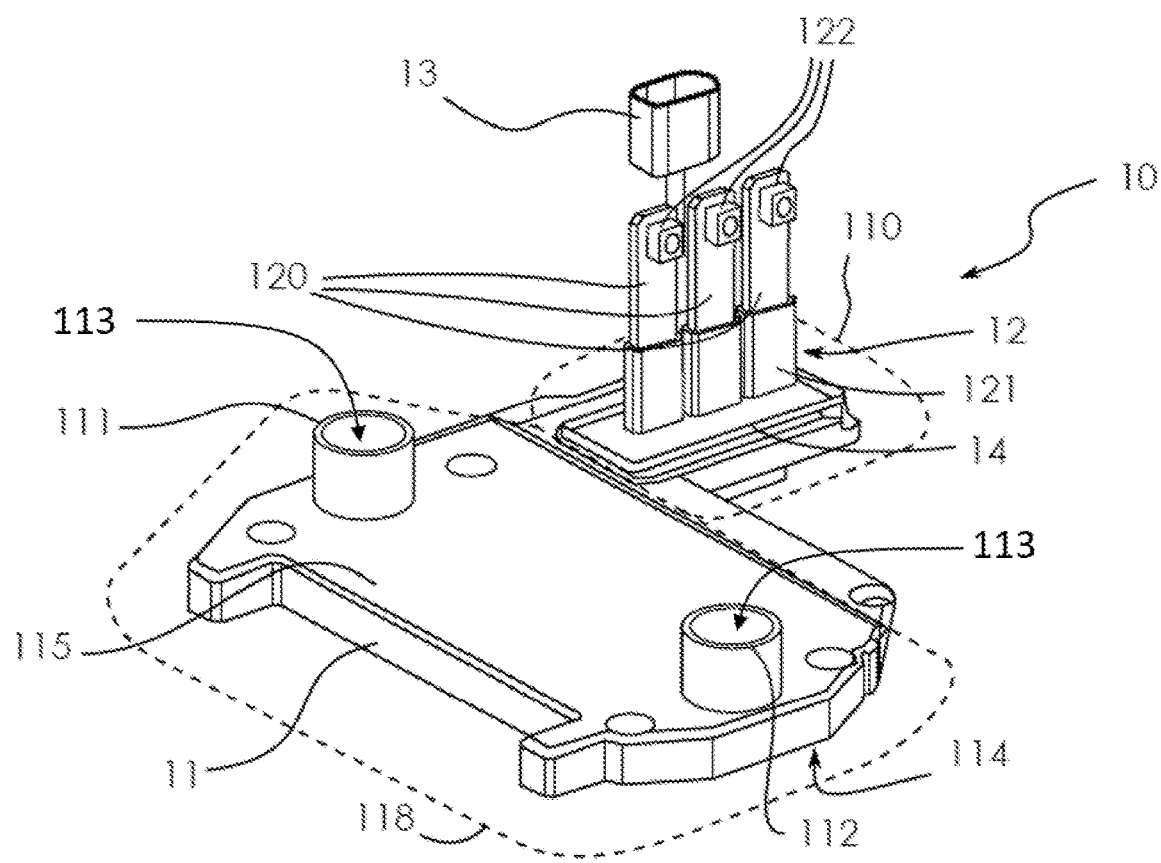
FIG. 1 represents an example of an electrical assembly according to the invention.

With reference to FIG. 1, an electrical assembly 10 is proposed, comprising a cooling module 11, a reception portion 110 of which receives, attached directly to said cooling module 11, an electrical busbar 12.

For example, electrical busbar 12 is screwed on to cooling module 11. Alternatively, electrical busbar 12 can be attached to the cooling module by heading or by flush fitting using gadroons, or by any other means.

A first advantage lies in the fact that the direct contact between electrical busbar 12 and cooling module 11 enables electrical busbar 12 to be cooled. Indeed, when using the electrical device to which electrical assembly 10 relates, when electrical busbar 12 receives electrical connectors, for example phase connectors of an electric vehicle motor when the electrical device is a power inverter of a vehicle, said electrical busbar 12 heats.

In the same context, electrical busbar 12 also comprises electrical connectors 120 with terminals 122 configured to be connected to corresponding terminals of another electrical device, for example a motor, which also causes electrical busbar 12 to heat.

Reception portion 110 extends from a first portion 118 of cooling module 11, where said first portion 118 has a first surface 114 and a second surface 115, and where said first and second surfaces 114, 115 are configured to receive, respectively, again according to the example mentioned above, an electronic power module and a capacitive link element.

Figure 2:
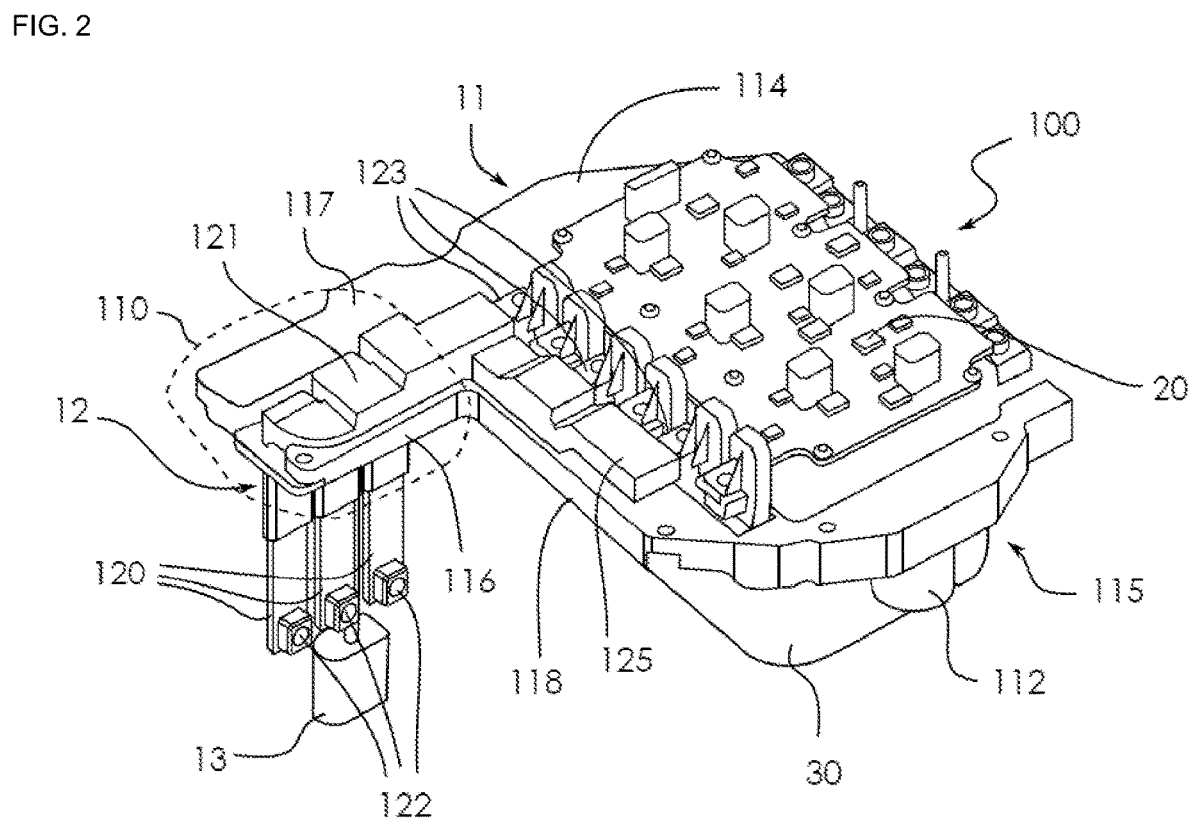

More specifically, as represented in FIG. 2, according to one implementation electrical busbar 12 comprises electrical conductors 120, in particular flat connectors of the "leadframes" type. Electrical terminals 123 of electrical conductors 120 are configured, at one end of electrical busbar 12, to be received by electrical terminals of an electrical device such as an electronic power module 20 of an inverter, where said electronic power module 20 is attached to cooling module 11 and cooled by it. According to this implementation, secondly, electrical busbar 12, at the end opposite the first end, comprises electrical terminals 122 configured to receive phase connectors of an electric motor powered by the inverter via electronic power module 20.

As represented in FIG. 1, cooling module 11 has, for example, a cooling liquid inlet 111 and a cooling liquid outlet 112.

Thus, in particular, the cooling liquid flows in channels 113 between first and second surfaces 114, 115 of cooling module 11. Cooling liquid inlet 111 and outlet 112 are, for example, made in second surface 115 of cooling module 11, i.e. on the surface to which capacitive link element 30 is attached, on the side opposite first surface 114 to which electronic power module 20 in FIG. 2 is attached.

Electrical busbar 12 can comprise a transmission module 13. Transmission module 13, integrated in electrical busbar 1, is in particular configured to connect to an electrical connector of an electrical device to sample an electrical signal representative of a physical property of the said electrical device. Such an electrical device is, for example, an electric motor controlled by electronic power module 20, where transmission module 13 transmits a signal representative of the position of the motor to, for example, a control card of the inverter.

According to one implementation a body 121 made of an electrically insulating material is comprised in electrical busbar 12 to hold electrical conductors 120 together, and to insulate them electrically between their electric terminals 122, 123. However, the body can be a material facilitating heat exchanges with cooling module 11. In particular, body 121 can be overmoulded, bonded or forcefully installed on electrical conductors 120 before electrical busbar 12 is added and attached on to said cooling module 11, in the area of the reception portion.

It should also be noted that a thermal interface can also be added between electrical busbar 12 and cooling module 11, in particular along body 21 of electrical busbar 12. Such a thermal interface can consist of a material of the TIM type ("Thermal Interface Material").

As represented in FIG. 1, electrical assembly 10, comprising cooling module 12 and electrical busbar 12 attached on a portion 110 designed to receive said cooling module 11, enables the rigidity of said electrical busbar 12 to be improved.

A sealing device 14 can be held in position on body 21, around busbar 12 such that it comes up, in particular, against a frame of the electrical device when electrical conductors 120 traverse an aperture of the frame and are then connected to another electrical device, in particular an electric motor.

Figure 3:
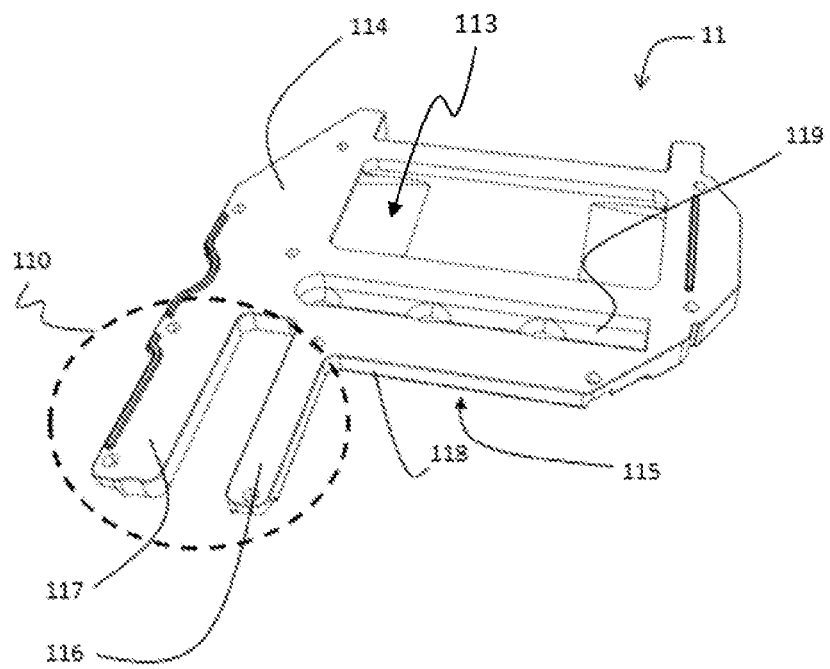
FIG. 3 shows an example of an electrical device, in this case an inverter, comprising an electrical assembly according to one example of the invention.
Figure 4:
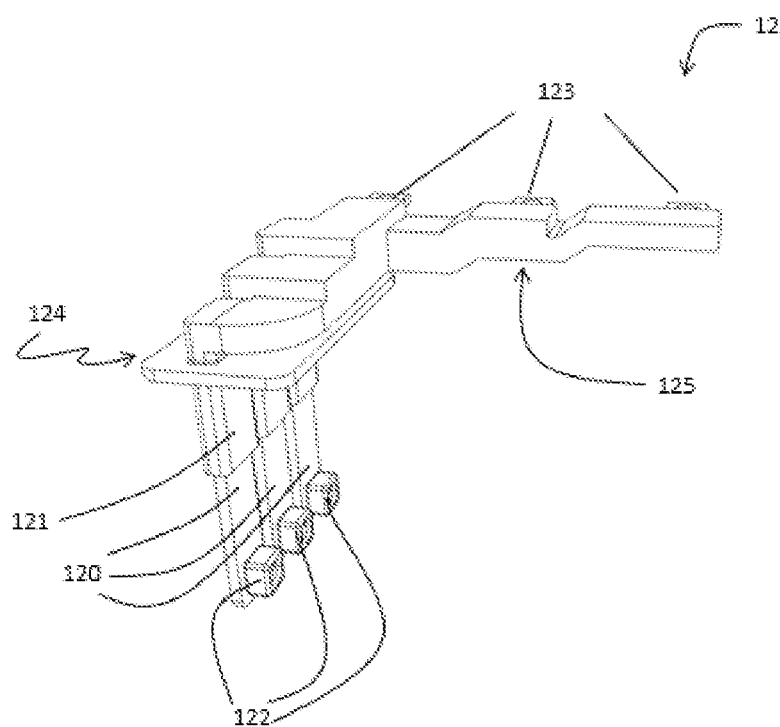
FIG. 4 shows a cooling module configured for an electrical assembly according to one example of the invention.

FIG. 3 represents, in isolation, a cooling module 11, as configured to form part of an electrical assembly according to one example of the invention. FIG. 4 represents, in isolation, an additional busbar 12, as configured to form part of an electrical assembly according to the same example of the invention.

In detailed fashion, according to the implementation represented in FIG. 3, cooling module 11 has a first portion 118 and a reception portion 110. First portion 118 comprises first surface 114 and second surface 115. Reception portion 110 comprises opposite faces which are respectively in the same plane as first surface 114 of cooling module 11, and as second surface 115 of cooling module 11. Cooling module 11 can comprise a cavity 119 configured to receive current sensors measuring the currents between electronic power module 20 and electrical busbar 12. The current sensors comprise, for example, magnetic C cores 40 (visible in FIG. 2).

In addition, again according to the implementation of FIG. 3, reception portion 110 forms a fork extending from first portion 118 of cooling module 11, where the said fork comprises two arms 116, 117.

With reference to FIG. 4, electrical busbar 12, in a corresponding fashion, comprises a first portion 124 configured to be held between the two arms 116, 117 of the fork which forms reception portion 110 (as also represented in FIG. 2). Electrical busbar 12 also comprises a cross arm 125 extending from one side of first portion 124, where said cross arm 125 is configured to be positioned at the junction of the fork with first portion 118 of cooling module 11. Cross arm 125 extends along first surface 114 of cooling module 11 and comprises connection terminals 123 which are configured to be positioned opposite terminals of a power module 20 attached to said first surface 114 of cooling module 11, and then be connected to them (as also represented in FIG. 2).

Figure 5:
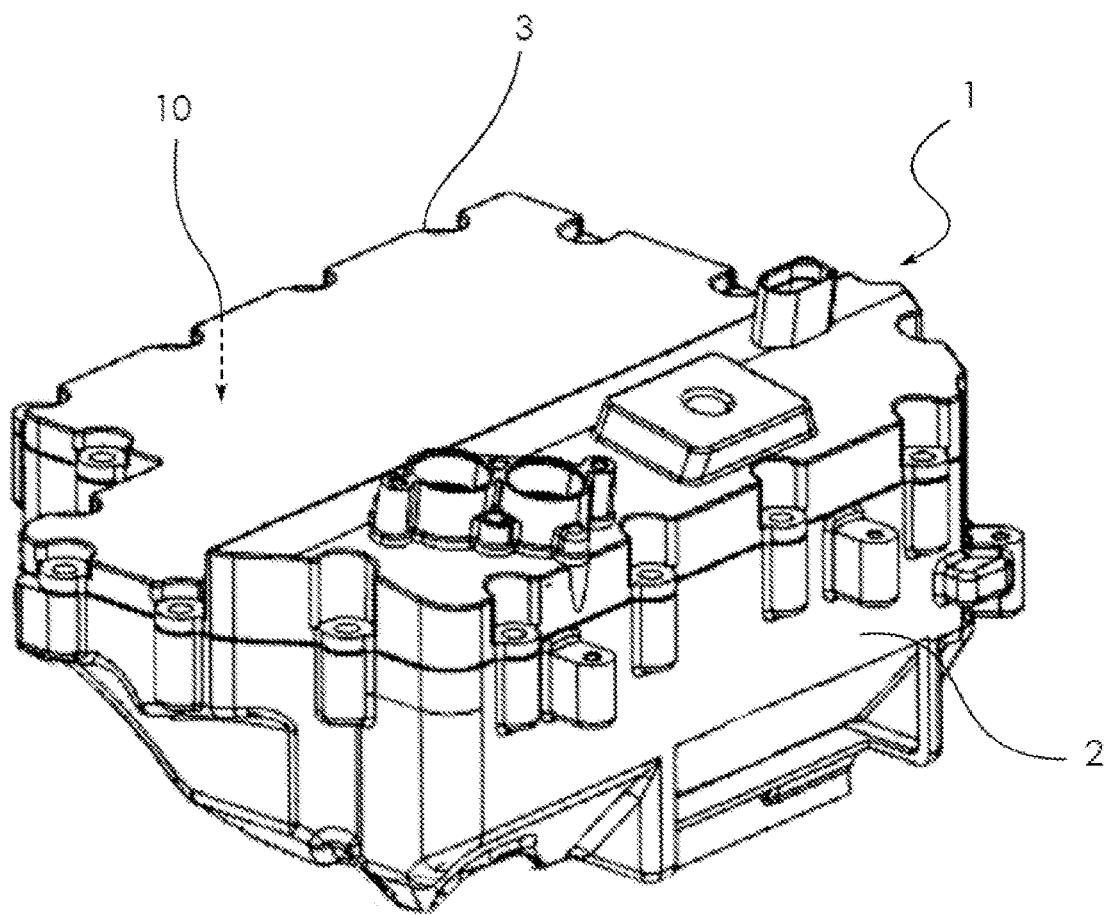
FIG. 5 shows an electrical busbar configured for an electrical assembly according to one example of the invention.

With reference to FIG. 5, electrical assembly 10 according to the invention is configured to be integrated in an electrical device 1, in particular an inverter.

The electrical device comprises an electrical assembly 10 according to the invention, with a cooling module and an electrical busbar, where the said cooling module is sandwiched between an electronic power module 20 and a capacitive link element 30.

In FIG. 5, a frame 2 is represented within which is held an electrical assembly 10, in particular equipped with an electronic power module and a capacitive link element, where said frame 2 is closed by a cover 3.

In particular, an electronic power module 20 is an assembly comprising a plurality of semiconductor chips forming an electrical circuit encapsulated in the same casing. More specifically, in the present case, electronic power module 20, as represented in FIG. 2, can be an assembly comprising components through which energy transits which powers an electrical machine, for example an electric motor, where the said components are configured, in particular, to transform a direct current into alternating currents or vice versa. Such an electronic power module 20 is configured to enable controlled passage of electrical energy between a high-voltage power battery and the electrical machine.

In addition, the term "capacitive link element" is understood to mean a DC-link capacitor, implementing a filtering function, in particular to stabilise the voltage supplied to the electronic power module.

Cooling module 11 is thus firstly configured to cool, firstly, electronic power module 20 and, secondly, capacitive link element 30.

According to the invention, cooling module 11 also cools electrical busbar 12.

In the implementation according to which electrical device 1 is an inverter, electrical busbar 12 is in particular an alternating busbar, configured to receive phase connectors of an electric motor powered by the said inverter, in particular in the location of electrical terminals 122, at the second end of busbar 120.

According to the invention, cooling module 11 thus acts as a bracket on which electrical busbar 12 is assembled and held in place.

In addition, electrical assembly 10 according to the invention enables electrical busbar 12 to be integrated in the control system controlling the cooling of the electrical device to which the said electrical assembly is added.

Cooling module 11, within electrical assembly 10 which it forms with electrical busbar 12, simultaneously implements, through said electrical busbar 12, a cooling function and a rigidification function.

Concerning the rigidification function, it should be noted that the improvement is, for example, obtained due to the fact that electrical busbar 12 is attached directly to cooling module 11.

It should also be noted that one advantage of the invention is that electrical assembly 10, comprising cooling module 11 and electrical busbar 12, attached to the said cooling module, in particular by screwing, is manufactured as a single part. Said electrical assembly 10 consequently forms an independent assembly, the functions of which can be tested separately.

In particular, on the base of electrical assembly 10 according to the invention, it is possible to assemble an electronic power module 20 and a capacitive link element 30 to form a subassembly of inverter 100.

Such a subassembly of inverter 100 can be tested independently, which improves the modularity of an inverter assembly method.

After it is tested independently, base electrical assembly 10 or inverter subassembly 100 can be added in a frame 2 which is closed by a cover 3 to form an electrical device 1, such as an inverter.

While the present disclosure has been illustrated and described with respect to a particular embodiment thereof, it should be appreciated by those of ordinary skill in the art that various modifications to this disclosure may be made without departing from the spirit and scope of the present disclosure.

What is claimed is:

1. An electrical assembly comprising a cooling module, in particular an active cooling module comprising a network in which a cooling liquid flows and an electrical busbar, where the electrical busbar is attached directly to a reception portion of the cooling module, where the electrical assembly is configured to be added in a frame of a first electrical device; and
   further comprising an electronic power module attached to a first surface of the cooling module and a capacitive link element attached to a second surface, opposite the first surface, of the cooling module; and
   in which the reception portion comprises opposite faces which are respectively in the same plane as the first surface of the cooling module and as the second surface of the cooling module.

2. The electrical assembly according to claim 1, in which the cooling module comprises a first portion comprising the first and the second surfaces, and in which the reception portion forms a fork extending from the first portion of the cooling module.

3. The electrical assembly according to claim 2, in which the electrical busbar comprises:
   a first portion held between two arms of the fork, and
   a cross arm extending from one side of the first portion, where the cross arm extends along the first surface of the cooling module and comprises connection terminals which are positioned opposite terminals of the power module and are then connected to them.

4. The electrical assembly according to claim 2, in which the cooling module has a cooling liquid inlet and a cooling liquid outlet, where the cooling module is configured such that the cooling liquid flows between the electronic power module and the capacitive link element.

5. The electrical assembly according to claim 1, in which the cooling module has a cooling liquid inlet and a cooling liquid outlet, where the cooling module is configured such that the cooling liquid flows between the electronic power module and the capacitive link element.

6. The electrical assembly according to claim 1, in which the electrical busbar comprises a body made of an electrically insulating material holding together conductors of the electrical busbar, where the body is placed next to the cooling module so as to enable thermal dissipation of the heat of the conductors to the cooling module.

7. An electrical assembly comprising a cooling module, in particular an active cooling module comprising a network in which a cooling liquid flows and an electrical busbar, where the electrical busbar is attached directly to a reception portion of the cooling module, where the electrical assembly is configured to be added in a frame of a first electrical device; and
   further comprising an electronic power module attached to a first surface of the cooling module and a capacitive link element attached to a second surface, opposite the first surface, of the cooling module; and
   in which the cooling module comprises a first portion comprising the first and the second surfaces, and in which the reception portion forms a fork extending from the first portion of the cooling module.

8. The electrical assembly according to claim 7, in which the electrical busbar comprises:
a first portion held between two arms of the fork, and
a cross arm extending from one side of the first portion, where the cross arm extends along the first surface of the cooling module and comprises connection terminals which are positioned opposite terminals of the power module and are then connected to them.

9. The electrical assembly according to claim 8, in which the cooling module has a cooling liquid inlet and a cooling liquid outlet, where the cooling module is configured such that the cooling liquid flows between the electronic power module and the capacitive link element.

10. The electrical assembly according to claim 8, in which the electrical busbar comprises a body made of an electrically insulating material holding together conductors of the electrical busbar, where the body is placed next to the cooling module so as to enable thermal dissipation of the heat of the conductors to the cooling module.

11. The electrical assembly according to claim 7, in which the cooling module has a cooling liquid inlet and a cooling liquid outlet, where the cooling module is configured such that the cooling liquid flows between the electronic power module and the capacitive link element.

12. The electrical assembly according to claim 7, in which the electrical busbar comprises a body made of an electrically insulating material holding together conductors of the electrical busbar, where the body is placed next to the cooling module so as to enable thermal dissipation of the heat of the conductors to the cooling module.

\* \* \* \* \*